United States Patent [19]
Fork et al.

[11] Patent Number: 6,160,273
[45] Date of Patent: Dec. 12, 2000

[54] DIODE PUMPED SOLID STATE EDGE EMITTING LIGHT SOURCE

[75] Inventors: David Kirtland Fork, Los Altos, Calif.; Zoran D. Popovic, Mississauga, Canada

[73] Assignee: Xerox Corporation, Stamford, Conn.

[21] Appl. No.: 09/115,641

[22] Filed: Jul. 15, 1998

[51] Int. Cl.$^7$ .................................................. H01L 33/00
[52] U.S. Cl. .......................... 257/98; 257/103; 257/40; 313/504
[58] Field of Search ............................. 257/98, 103, 40; 313/504

[56] References Cited

U.S. PATENT DOCUMENTS

| | | | |
|---|---|---|---|
| 3,593,055 | 7/1971 | Geusic | 257/98 |
| 3,932,881 | 1/1976 | Mita | 257/98 |
| 5,813,753 | 9/1998 | Vriens | 313/504 |
| 5,874,803 | 2/1999 | Garbuzov | 313/504 |
| 5,949,187 | 9/1999 | Xu | 313/504 |

OTHER PUBLICATIONS

Shi et al., "Doped organic electroluminescent devices with improved stability," Appl. Phys. Lett., vol. 70, No. 13, Mar. 31, 1997, pp. 1665–1667.

Hosokawa et al., "Performance of RGB Multi–Color Organic EL Display," IS&T's 49$^{th}$ Annual Conference.

Hosokawa et al., "L2.3: Organic Multicolor EL Display with Fine Pixels," SID 97 Digest, pp. 1073–1076.

Kun et al., "TFEL Edge Emitter Array for Optical Image Bar Applications," Proceedings of the SID, vol. 28/1, 1987.

Hiramoto et al., "Directed beam emission from film edge in organic electroluminescent diode", Appl. Phys. Lett., vol. 62, No. 7, Feb. 15, 1993, pp. 666–668.

Fujihira et al., "Growth of dark spots by interdiffusion across organic layers in organic electroluminescent devices," Appl. Phys. Lett, Mar. 25, 1996, pp. 1787–1789.

*Primary Examiner*—Jerome Jackson, Jr.
*Attorney, Agent, or Firm*—Oliff & Berridge, PLC

[57] ABSTRACT

A OLED-based edge emitter mitigates the problem of unacceptably large losses by physically separating the OLED from the waveguide using an optical cladding layer. An additional advantage over conventional surface emitting OLEDs used in image bars is the pixel aspect ratio of the edge emitter. The pixel-aspect ratio is narrow in the process direction forming a rectangle. This rectangular shape allows movement to make an effective square. Therefore, emission modulation can be performed at a high duty-cycle because the edge is much shorter in the process direction than in the lateral, i.e., fast scan direction. As a result, the duty cycle of the light source can be higher, i.e., the light source is on for a longer time, without smearing an irradiated spot into locations corresponding to adjacent pixels.

23 Claims, 16 Drawing Sheets

DIODE PUMPED SOLID STATE EDGE EMITTING LIGHT SOURCE

BACKGROUND OF THE INVENTION

1. Field of Invention

This invention relates to a system for passively integrating light from a diode pumped waveguide. Specifically, this invention uses an organic light emitting diode (OLED) to optically pump an image bar.

2. Description of Related Art

Organic light emitting diodes (OLEDs) are known and used conventionally as light emitters in image forming devices, such as displays. However, OLEDs are often unable to provide enough light to a photoreceptor of an electrophotographic print engine to allow the image forming engine to operate at a sufficiently high process speed. FIG. 1 illustrates a conventional OLED. In devices that emit light normal to their substrate, such as that illustrated in FIG. 1, a large percentage of the light generated by the OLED does not reach the photoreceptor. This large percentage of light loss in conventional OLEDs is a result of a number of lossy interactions. Furthermore, the amount of current input to the OLED is limited because the materials used to form the OLED have a maximum acceptable current density.

In particular, compared to inorganic light emitting diodes (LEDs), OLEDs are inferior because the inorganic LEDs can produce several hundred to several thousand times more light per unit area, primarily by operating at much higher current density. The organic architectural equivalent of an inorganic LED image bar exposes the photoreceptor at no more than a fraction of one page per minute. The exposure speed is slow because the amount of light emitted by an OLED necessary to expose the photoreceptor to the requisite degree to dispose a latent image on the photoreceptor occurs only over a significant amount of time. This slow exposure speed is not viable for commercial image bars.

Therefore, conventional OLEDs are not bright enough to use as light emitters for image forming engines that print at commercially required process speeds. This occurs both because of the less than 100% quantum efficiency of an OLED and because the necessary current density cannot be input into the OLED. If a sufficiently high amount of current could be input to the OLED, then a sufficiently high amount of light for image forming engines could be output from the OLED, regardless of the quantum efficiency. However, presently, the maximum current density input for conventional OLEDs is limited to approximately 20 mA/cm$^2$. Exceeding the maximum current density causes the OLEDs to heat up and self-destruct. In other words, the OLEDs self-heat. This self-heating is a form of resistive heating. OLEDs are much more susceptible to damage as a result of self-heating than solid-state emitters because they use organic layers that melt or decompose at lower temperatures.

There have been a number of attempts to overcome this low quantum efficiency, by combining an OLED with electronic integration, as described in U.S. patent application Ser. No. 08/785,230 entitled "Integrating Xerographic Light Emitter Array" filed Jan. 17, 1997, and U.S. patent application Ser. No. 08/785,233 entitled "Integrating Xerographic Light Emitter Array with Grey Scale", filed Jan. 17, 1997, to Fork and Popovic, and by combining a thin film OLED with an edge emitter waveguide and electron injection layer, as described in U.S. patent application Ser. Nos. 08/771,089 entitled "Thin Film Organic Light Emitting Diode with Edge Emitter Waveguide filed Dec. 20, 1996 and 08/782,134 entitled "Thin Film Organic Light Emitting Diode with Edge Emitting Waveguide and Electron Injection Layer filed Jan. 13, 1997 to Wilson and Fork, each incorporated herein by reference in their entities. A similar structure is described in "Directed Beam Emission from Film Edge in Organic Electroluminescent Diode" by Hiramoto et al. Appl. Phys. Lett. 62(7) 666 (1973). However, as shown in FIG. 2, in the conventional edge emitting schemes, a light generating medium is in direct contact with a waveguide. This is problematic because the electrodes of the OLED directly induce an optical loss in the waveguide, which limits the effectiveness of the edge emitter.

As shown in FIG. 3, another conventional design is a thin film electro-luminescent (TFEL) device as described in "TFEL Edge Emitter Array for Optical Image Bar Applications", Kun et al. Proc. SID. 28(1), 81 (1987). A TFEL edge emitter utilizes thin film electroluminescent layers as a waveguide core substructures. These substructures, like analogous structures which can be made for OLEDs, have unacceptably large losses, on the order of 100 dB/cm. Therefore, conventional edge emitters that utilize organic materials do not generate sufficient light for commercially acceptable image forming applications.

SUMMARY OF THE INVENTION

This invention uses a thin film electroluminescent device, such as an OLED, to pump a photoluminescent waveguide. This structure of the emitter passively integrates light to obtain an edge emitting facet many times brighter than the surface emission from the pump source. By using passive integration, instead of time delay and integration, the drive electronics are only required to supply a single row of emitters per line time, i.e., the time necessary to process one line in the processing direction. This arrangement reduces the complexity of both the emitter and its driver. This invention is applicable to a single light source or to arrays of light sources. The invention is particularly applicable in image bars.

This invention mitigates the problem of unacceptably large losses by physically separating the light emitter from the waveguide using an optical cladding layer. An additional advantage of this invention over conventional surface emitting image bars is the pixel aspect ratio. The pixel aspect ratio is the height-to-spacing ratio of the pixel. In this invention, the pixel is narrow in the process direction, forming a rectangle. This rectangular shape allows movement of the photoreceptor in the process direction to make an effective square. Therefore, modulation can be performed at a high duty-cycle because the edge of the emitter is much narrower in the process direction than in the lateral, i.e., fast scan, direction. As a result, the duty cycle of the light source can be higher, i.e., the light source is on for a longer time during the entire line time, without smearing an irradiated spot into locations corresponding to adjacent pixels.

Because the pump diode is separated from the luminescent waveguide by a cladding layer, this OLED structure provides at least two advantages. The first advantage is the ease of making a waveguide with low optical loss. Second, packaging of the emitter is easier since the waveguide and its cladding layer can be provided underneath a cover glass that encloses and hermetically seals the pump diode.

Therefore, this invention provides an OLED with an increased brightness (i.e., the light per unit area from the source is increased) that is provided, in part, by emitting the light from the edge of the emitter (i.e., the edge of the substrate on which the emitter is grown) rather than from the broad surface of the substrate. The edge-emitter is many times longer than it is wide, for example, a thousand times longer. By making the edge emitter long, the edge emitter can handle one thousand times more input current capacity than a surface emitting OLED. Large current is input at a low current density into a long stripe. The long stripe is on the surface of the emitter and the amount of area of the stripe is large, i.e., larger than a pixel.

Pump photons are produced in the long straight section of the pump diode and subsequently produce re-emitted photons that exit the emitter through a cascade of interactions. The photons are emitted from the edge because of the waveguiding nature of the fluorescent medium. Therefore, a low current density is maintained on the surface of the emitter, to improve the longevity of the emitter. That is, the risk of self-heating is significantly reduced while a significantly higher photon density is produced at the edge of the emitter. This increased photon density improves the capabilities of the emitter for use in an image forming engine.

Additionally, if an OLED is used as a pump diode in the emitter, the present invention has those advantages which apply to all OLEDs. Namely, the emitter according to this invention is a diode-pumped, solid-state edge-emitting light source which is inexpensive to process and may be fabricated over large-area glass substrates. All the layers required in the emitter according to this invention can, in theory, be fabricated by large-area thin film processing techniques at low temperature, which allows many emitters to be fabricated on a single glass plate, and which allows the emitters to be easily cut out of the single glass plate as an integrated image bar. For example, about 40 image bars can be fabricated out of a single 360×480 mm plate. Consequently, the total cost of processing the glass plate in large volumes is lower than the cost of fabricating flat panel displays on a comparable substrate size. As a result, the cost per plate is reduced, leading to a reduction in emitter cost.

BRIEF DESCRIPTION OF THE DRAWINGS

The preferred embodiments of this invention will be described in detail, with reference to the following figures, wherein.

DETAILED DESCRIPTION OF PREFERRED EMBODIMENTS

Figure 1:
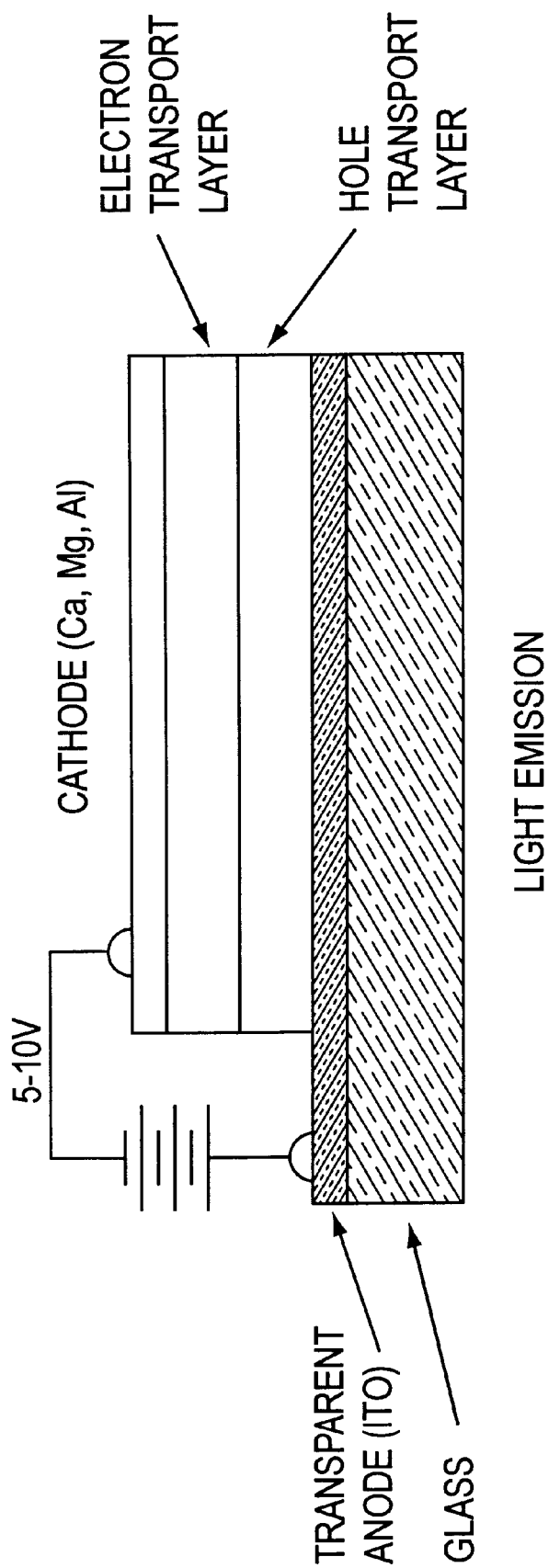
FIG. 1 illustrates a conventional OLED.
Figure 2:
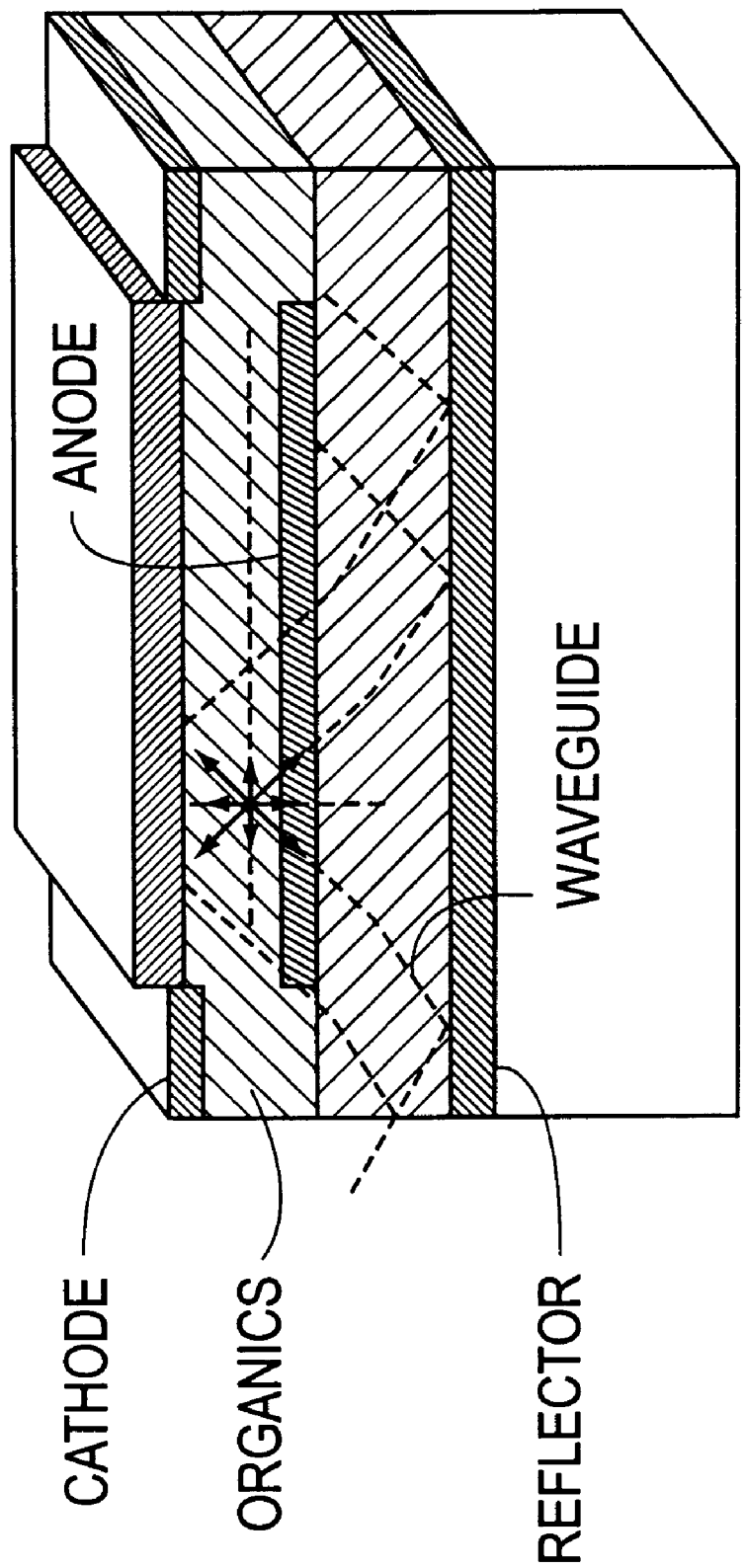
FIG. 2 illustrates a conventional OLED in which the light generating medium is in direct contact with a waveguide.
Figure 3:
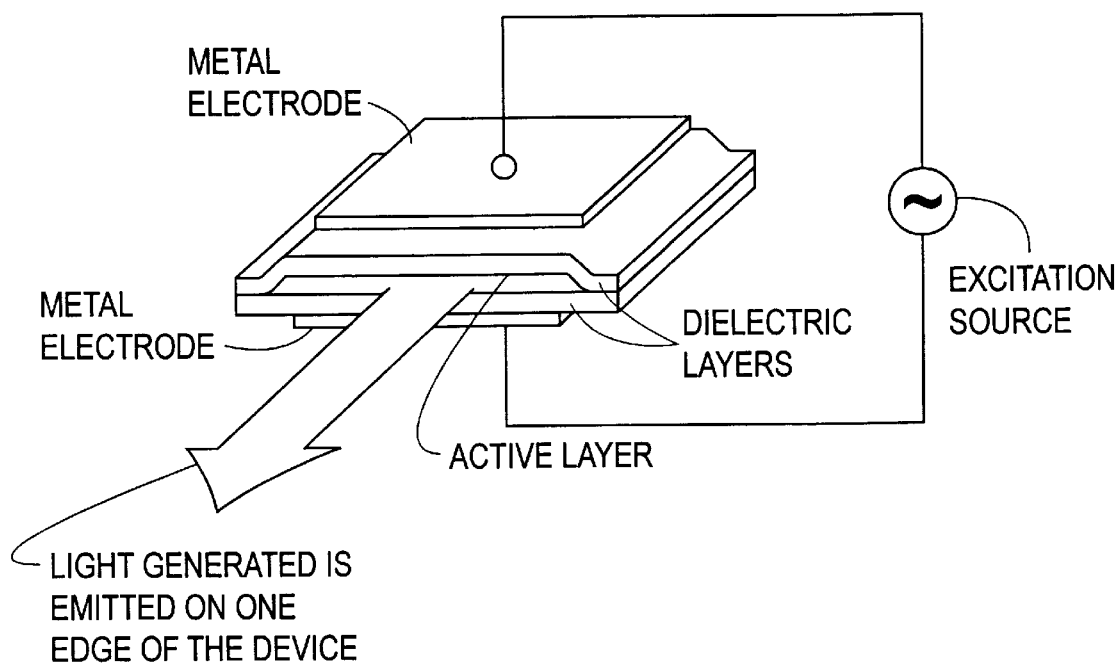
FIG. 3 illustrates a conventional TFEL edge emitter structure.
Figure 4:
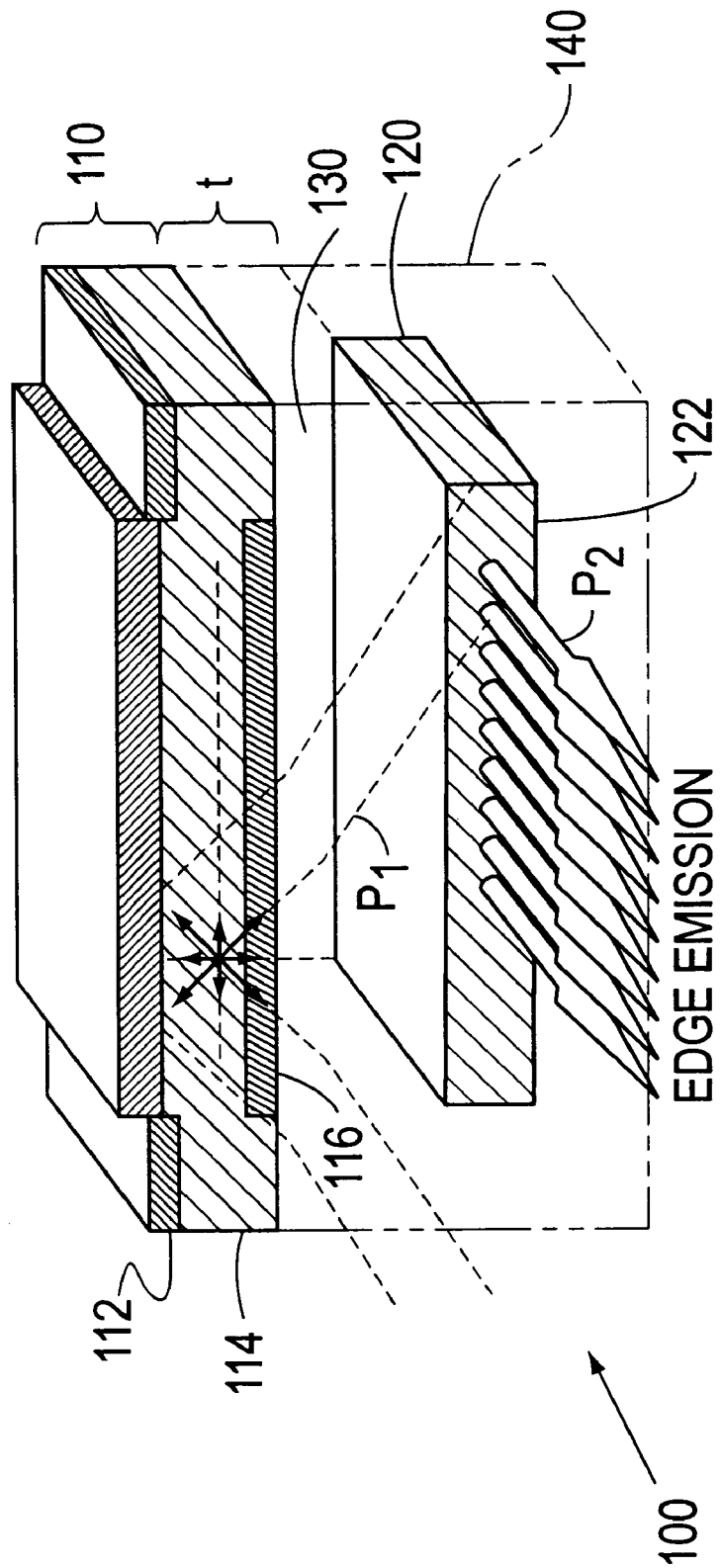
FIG. 4 is a schematic drawing of an edge emitter structure according to a first embodiment of this invention.

FIG. 4 is a schematic drawing of a diode pumped edge-emitter 100 according to a first preferred embodiment of the invention. As shown in FIG. 4, the diode pumped solid state edge emitting light source 100 utilizes an OLED 110 as the pump source. However, the edge emitter 100 could alternatively use an inorganic LED, a thin film electroluminescent device, or one of a variety of thin film light emitting devices. Any light emitting device will work as a pump source, provided the wavelengths of the generated photons are short enough, e.g., in the visible light to soft UV light range. OLEDs are used in the preferred embodiment because OLEDs can be grown at room temperature and on top of other devices, such as, for example, the fluorescent medium. Therefore, the optical source is inexpensive to fabricate and easy to utilize in comparison with inorganic LEDs which must be fabricated only within a specific range of temperatures and under rigorous conditions.

As shown in FIG. 4, the OLED 110 is placed above and illuminates a fluorescent medium 120, which also acts as a waveguide. The fluorescent medium 120 absorbs a photon $P_1$ having a first wavelength generated by the OLED 110 and re-emits another photon $P_2$ having a longer wavelength than the first wavelength. The re-emitted photon $P_2$ derives its energy from the energy of the absorbed photon $P_1$. As shown in FIG. 4, the OLED includes a cathode 112, an organic layer 114 and an anode 116.

The fluorescent medium/waveguide 120 is separated from the OLED 110 by a cladding layer 130. The cladding layer 130 has a lower refractive index than the refractive index of the fluorescent medium/waveguide 120. Preferably, the thickness t of the cladding layer 130 between the fluorescent medium/waveguide 120 and the OLED 110 is comparable to the wavelength of the photons generated in the fluorescent medium/waveguide 120. However, the refractive index step between the cladding layer 130 and the waveguide 120 must be reasonable for this thickness. For example, an index step of 0.5 is preferable, but an index step within the range 0.1–0.3 is acceptable. Some of the photons generated in the fluorescent medium 120 will be emitted into propagating modes of the waveguide. Each of the propagating modes will have an evanescent tail, the intensity of which decays exponentially in the cladding. The distance over which the evanescent tail of the mode decays depends on factors including the waveguide core thickness and the index step. For index step values on the order of 0.1 to 0.5 the distance to decay by a factor of (1/e) can be on the order of a wavelength. The backside 140 of the edge emitter 100 is preferably reflective so that light is emitted from only one side of the edge emitter. The fluorescent medium/waveguide 120 includes an edge facet 122 from which the photons $P_2$ are emitted from the edge emitter 100.

The cladding layer 130 is non-conductive, because materials with electrical conductivity invariably have large optical absorption which undermines using the fluorescent medium 120 as the waveguide. The cladding layer 130 is preferably a dielectric material, either organic or inorganic, and more preferably is silicone dioxide. The cladding layer 130 must be transparent to emitted light and selected so that the OLED 100 can be grown on top of the cladding layer 130 during fabrication.

Figure 5:
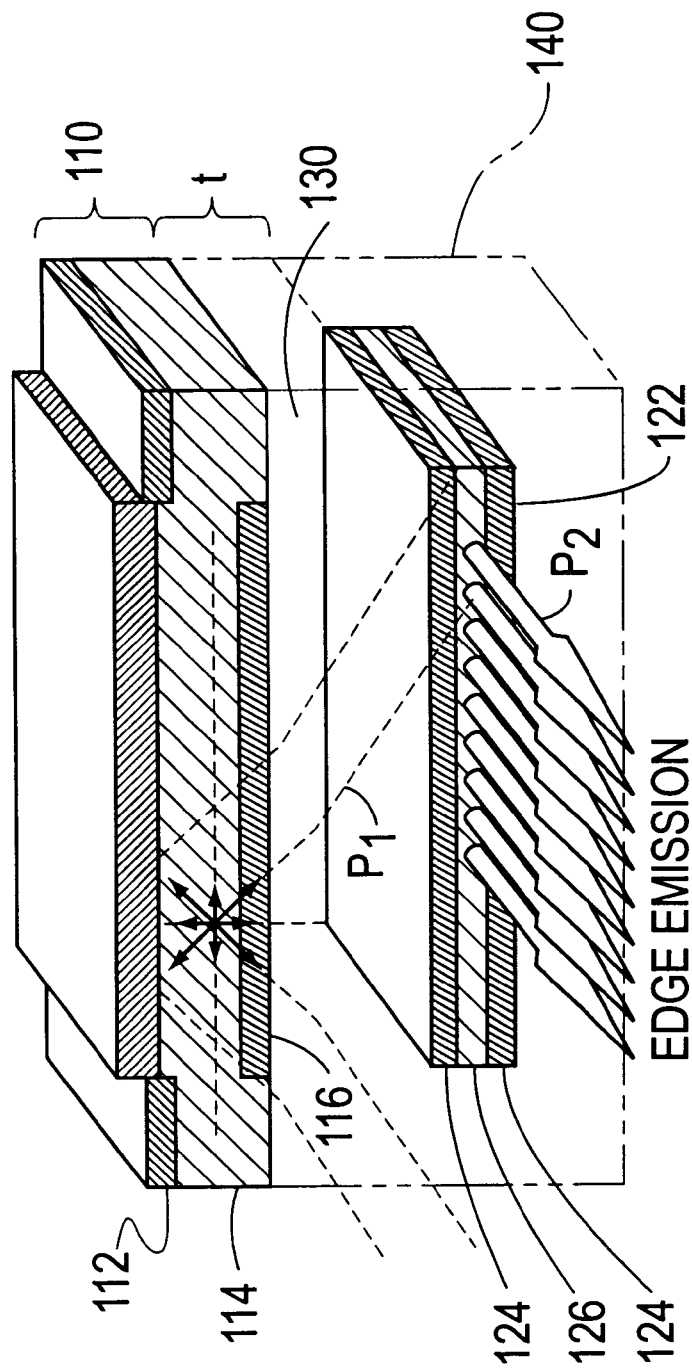
FIG. 5 illustrates a multilayer structure of fluorescent material and light guiding material.

In order for the cladding to be effective, it must surround the waveguide core on the sides perpendicular to the direction of propagation. In FIG. 4, the cladding is composed of material above, below, and to the sides of the fluorescent medium/waveguide 120. Therefore, the cladding may include a substrate on which the edge emitter 100 is fabricated. This substrate may be, for example, glass, plastic or quartz. As shown in FIG. 5, portions of the cladding layer 130 may be one or more types of thin film layers, such as, for example, silicon oxide, silicon nitride, spin on glass, or polyimide, that act as sub-structures. The parts of the cladding layer 130 need not have the same index of refraction, as long as all the indices are lower than the index of refraction of the fluorescent medium/waveguide 120.

The cladding layer 130 is built up by micro-electronic thin film techniques such as patterning, etching and lithography. Alternatively, the cladding layer 130 may be formed by diffusion of some type of impurity into, e.g., silicate. Additionally, the cladding layer 130 may be formed by deposition, such as conventional printing techniques, e.g., ink-jet printing type delivery.

The photons $P_1$ emitted by the pump OLED 110 are emitted within the body of the OLED 110 in a variety of directions. Some of the photons $P_1$ strike the fluorescent medium/waveguide 120, which has the properties of a dye imbedded in the medium 120. The dye absorbs the photons $P_1$ and emits the photons $P_2$. Using dyes, the fluorescent medium 120 performs down-conversion, i.e., the dye absorbs a high energy photon having a relatively shorter wavelength and emits a lower energy photon having a relatively longer wavelength in a random direction.

The fluorescent medium 120 may be fractional, i.e., it may be tuned to whatever optical density is desired by adjusting the concentration of the fluorescing component in a solid solution during fabrication or by other methods, such as forming a multilayer structure including fluorescing material and light guiding material. The fluorescent medium 120 should provide optical confinement and fluorescence. If both of these characteristics cannot be provided in one medium, separate sub-structures of fluorescing material 124 and light guiding material 126 should be used, as shown in FIG. 5.

The fluorescing material need not be a pure dye. The fluorescing material may be an inorganic material. The fluorescing material may be a mixture of dye plus medium. For example, the dye may be dissolved into polyamide, polystyrene or some other host. The concentration of the dye is varied to choose the characteristics of the fluorescing medium 120. If a heavy dye concentration is used, all the light may be absorbed on the top surface of the fluorescent medium 120. If the light is re-emitted from the top surface, the fluorescent medium 120 may not optimally couple light into its lowest order mode. Ideally, the dye re-emits over the entire cross section of the fluorescent medium 120, so that the mode overlaps a final mode profile as much as possible. This overlap generally indicates how much generated light will actually be confined within the fluorescent medium/waveguide 120.

Theoretically, the structure illustrated in FIG. 4 may be inverted so that the fluorescent material 120 is deposited over the OLED 110 and the OLED 110 emits upward. Since the OLED 110 may be designed to emit either through the anode 116 or through the cathode 112, the pumping OLED 110 need not irradiate the fluorescent medium 120 throughout the anode 116.

As discussed above, the refractive index of the fluorescent medium/waveguide 120 is higher than the surrounding cladding layer 130. As a result, a portion of the light generated in the fluorescent medium 120 is trapped by total internal reflection. The other portion of the light generated in the fluorescent medium 120 propagates out of the fluorescent medium/waveguide 120 to the edge of the emitter 100, where the light escapes as an edge emission. The cladding layer 130 is sufficiently thick so that the evanescent tail, i.e., the exponentially decaying part of the waveguided light which reaches the anode 116, is an insignificant fraction of mode power, thereby minimizing the optical losses in the waveguide caused by absorption in the anode.

To clearly explain the advantages of the preferred embodiments, the edge emitter 100 according to the first embodiment of the invention will be explained using a discussion of the process by which a photon is generated and reaches an external photoreceptor. This process occurs in nine stages: (1) pump photon generation by the OLED 110; (2) pump photon impingement on the fluorescent medium 120; (3) pump photon absorption by the fluorescent medium 120; (4) photoluminescence of the emitted photons emitted by the fluorescent material 120; (5) waveguide collection of the emitted photons; (6) propagation of the collected photons; (7) emission of the propagated photons from the edge emitter 100; (8) impingement of photons on a selfoc lens; (9) and transmission of the collected photons through the selfoc lens into the photoreceptor.

Each of these process stages has an efficiency associated with it. By improving the efficiency of each stage, the external quantum efficiency of the edge emitter 100, i.e., the ratio of the photons P2 emitted from the waveguide 120 to the electrons entering the OLED 110, is improved.

1. Pump Photon Generation

Electrons are injected into the OLED 110 acting as the pump diode. The OLED 110 produces pump photons $P_1$. As is well know in the art, the internal quantum efficiency of OLEDs is currently limited to 25% due to the formation of the triplet state. The actual internal efficiency of OLEDs fabricated with available materials is more typically about 10% to 15%.

2. Pump Photon Impingement on the Fluorescent Medium

Figure 6:
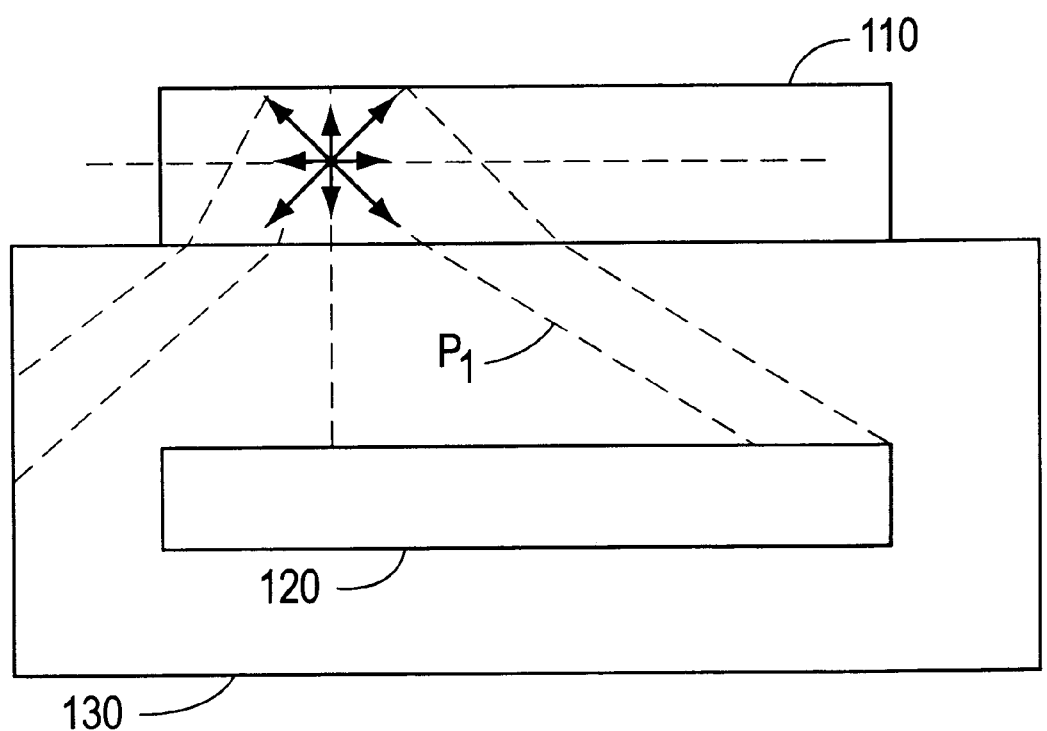
FIG. 6 illustrates the relationship between the fluorescent medium and the emitted photons.

Only a portion of the pump photons $P_1$ generated by the OLED 100 successfully reach the fluorescent medium 120. That is, only that portion of the pump photons $P_1$ that is emitted into the solid angle subtended by the fluorescent medium 120 reaches the fluorescent material 120. FIG. 6 illustrates the relationship between the fluorescent medium 120 and the pump photons $P_1$. To determine the fraction of successfully absorbed photons $P_1$, the photons $P_1$ emitted isotropically in the emitter layer of the OLED 10 and ray bending at the interface between the OLED 110 and the cladding layer 130 must be taken into account. Ray bending reduces the coupling into the fluorescent material 120. If the OLED includes a microcavity, then the light is not emitted isotropically and the effects of ray bending can be reduced. In that case, it is not necessary to assume isotropic light emission.

As shown in FIG. 6, whether a photon $P_1$ at a given angle is captured by the fluorescent material depends on where in the OLED 110 the photon $P_1$ is emitted. Integration along the width of the OLED 110 determines the average capture cross section of the fluorescent medium 120. The approximate expression for the average capture cross section, $\eta_{cap}$ is:

$$\eta_{cap} = \frac{1}{w}\int_0^w \eta(x)dx, \quad (1)$$

where:

w is the width of the emitter 110 and/or fluorescent medium 120;

x is the position along the OLED 110; and $\eta(x)$ is the capture cross section from a segment at position x.

In particular $\eta(x)$ is given as:

$$\eta(x)=1-\tfrac{1}{4}(\cos\theta_R+\cos\theta_L+\cos\theta c) \quad (2)$$

and:

$$\sin\theta_R = \frac{n_{cl}}{n_e}\frac{(w-x)}{\sqrt{(w-x)^2+t_{cl}^2}}; \quad (3)$$

$$\sin\theta_R = \frac{n_{cl}}{n_e}\frac{(x)}{\sqrt{x^2+t_{cl}^2}}; \text{ and} \quad (4)$$

$$\sin\theta_c = \frac{n_{cl}}{n_e} \quad (5)$$

where:

$n_{cl}$ is the refractive index of the cladding layer 130; and $n_e$ is the refractive index of the emitting portion of the OLED 110.

3. Pump Photon Absorption by the Fluorescent Medium

The photon $P_1$ generated by the pump OLED 100 must be absorbed by the fluorescent medium/waveguide 120 in order to have any light-generating effect. Therefore, the fluorescent medium 120 preferably includes a combination of materials that provide a large absorption cross section for pump photons. The photon $P_1$ needs to have a higher energy level than the photons $P_2$ emitted by the fluorescent medium/waveguide 120. To achieve effective absorption of the photon $P_1$ by the fluorescent medium/waveguide 120 without also strongly absorbing the emitted photons $P_2$, a significant separation in wavelength between the pump photons $P_1$ and the emitted photons $P_2$ is necessary.

For waveguiding purposes, the fluorescent medium/waveguide 120 preferably includes materials that have a large Stoke's shift, such as organic dyes. A Stoke's shift is a shift between the absorption spectrum and the luminescence spectrum. The amount of pump photons $P_1$ absorbed by the fluorescent medium/waveguide 120 may be controlled by varying the concentration of the absorber molecules. Ideally, the fluorescent medium/waveguide 120 should appear as opaque as possible to the pump photons $P_1$, so that the pump photons $P_1$ are preferentially absorbed. In contrast, the fluorescent medium/waveguide 120 should simultaneously appear as transparent as possible to the re-emitted photons $P_2$. Therefore, the fluorescent medium/waveguide 120 material preferably has a significant Stoke's shift.

4. Photoluminescence of the Emitted Photons

One of the attractive features of the organic materials is their high photoluminescence efficiency. Emitter materials used in polymeric OLEDs achieve a 60% photoluminescence efficiency. The following discussion assumes that a value of 60% can be attained by using similar materials in the fluorescent medium/waveguide 120. Many of the solid solutions used in solid state lasers have efficiency close to 100%. In early demonstrated OLED color displays, organic fluorescent color change media were used to down-convert from blue to green and red wavelengths. A similar scheme may be used to form the waveguide element of the edge emitter according to this invention.

5. Waveguide Collection of the Emitted Photons

Figure 7:
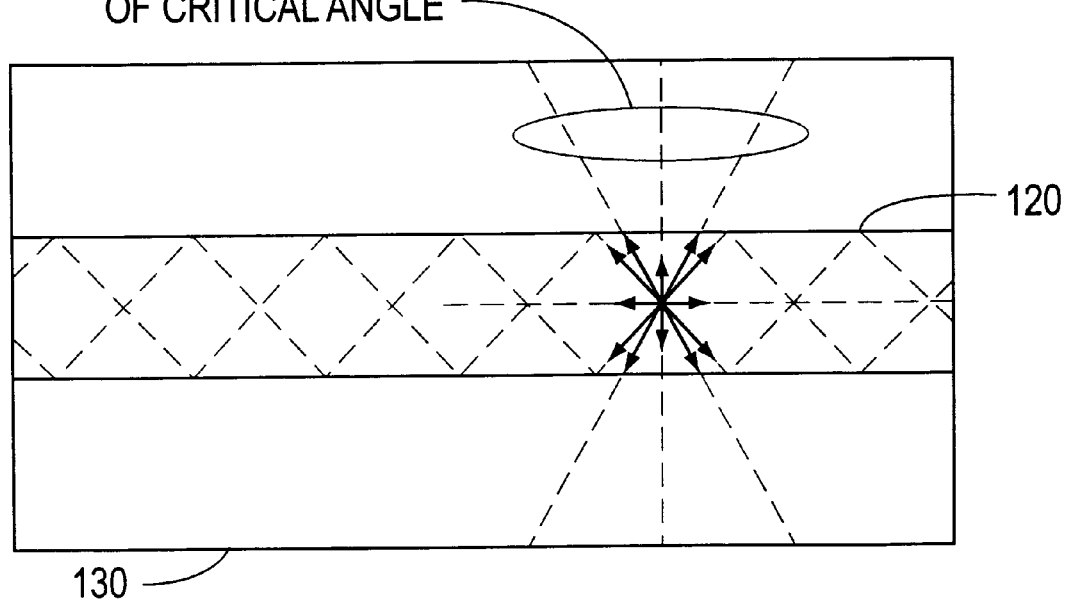
FIG. 7 illustrates relationship between photons collected in and emitted from the waveguide.

Photons emitted within the waveguide 120 escape unless they are emitted within a cone defined by the critical angle of the waveguide 120. As shown in FIG. 7, the waveguide 120 emits photons isotropically and collects only those photons within the cone. The collection efficiency, $\eta_{collection}$, is determined by integrating the solid angle subtended by this cone, and is determined as:

$$\eta_{collection} = 1 - \frac{n_{cl}}{n_g}, \quad (6)$$

where $n_g$ is the refractive index of the waveguide and $n_{cl}$ is the refractive index of the cladding.

The collection efficiency for conventional materials is low, i.e., on the order of 5 to 20%, depending upon the refractive indices of the waveguide and the cladding layer. Stimulated emission can be used to improve the collection efficiency. However, stimulated emission requires high pump powers.

6. Propagation of the Collected Photons

The photons $P_2$ generated in the fluorescent medium/waveguide 120 are propagated with some optical loss. Those photons $P_2$ that are emitted toward the rear end of the waveguide 120 reflect back with some loss of energy. The propagation efficiency, i.e., the ratio of the photons $P_2$ reaching the edge facet 122/photons launched down the waveguide 120, is expressed by:

$$\eta_{propagation} = \frac{1}{2\kappa l}[1+(R_B-1)e^{-\kappa l}-e^{-2\kappa l}] \quad (7)$$

$$\kappa = \frac{\ln 10}{10}d$$

where:

$R_B$ is the reflectivity of the back facet; l is the length of the guide;

d is the waveguide loss in decibels per centimeter db/cm; and $\kappa$ is the power attenuation coefficient for light propagation along the waveguide.

For a waveguide 120 with waveguide loss of dB/cm and a back reflector 140 that is 50% efficient, the propagation efficiency is about 62%. If the fluorescent medium/waveguide 120 is photodefinable, i.e., fabricatable by light processing, such as photolithography, and formed by spin casting, it may be possible to inexpensively fabricate fairly low loss guides, for example, waveguides have a waveguide loss of less than 3 dB/cm. Inorganic phosphor films, such as ZnS:Mn, tend to be very lossy, i.e., have waveguide losses greater than 3 dB/cm, due to internal scattering resulting from roughness on the waveguide surfaces. The fluorescent medium/waveguide 120 surface roughness is preferably minimized to provide the most amount of guided light.

7. Emission of the Propagated Photons

The photons $P_2$ are emitted from the edge emitter 100 once the photons $P_2$ reach the edge facet 122 of the fluorescent medium/waveguide 120. The photons $P_2$ which reach the edge facet 122 are divided into a transmitted component and a reflected component. The emission efficiency, $\eta_e$ is given approximately by:

$$\eta_e = 1 - \left(\frac{n_g - 1}{n_g + 1}\right)^2; \tag{8}$$

where $\eta_g$ is the index of the core of the waveguide.

Equation (8) applies primarily to light exiting at normal incidence to the edge facet 122. However, Equation (8) is a good approximation for those photons $P_2$ reaching the imager selfoc lens. The losses due to the reflection at the edge facet 122 are small and can be mitigated with an antireflective coating.

8. Impingement of photons on the Selfoc lens

Figure 8:
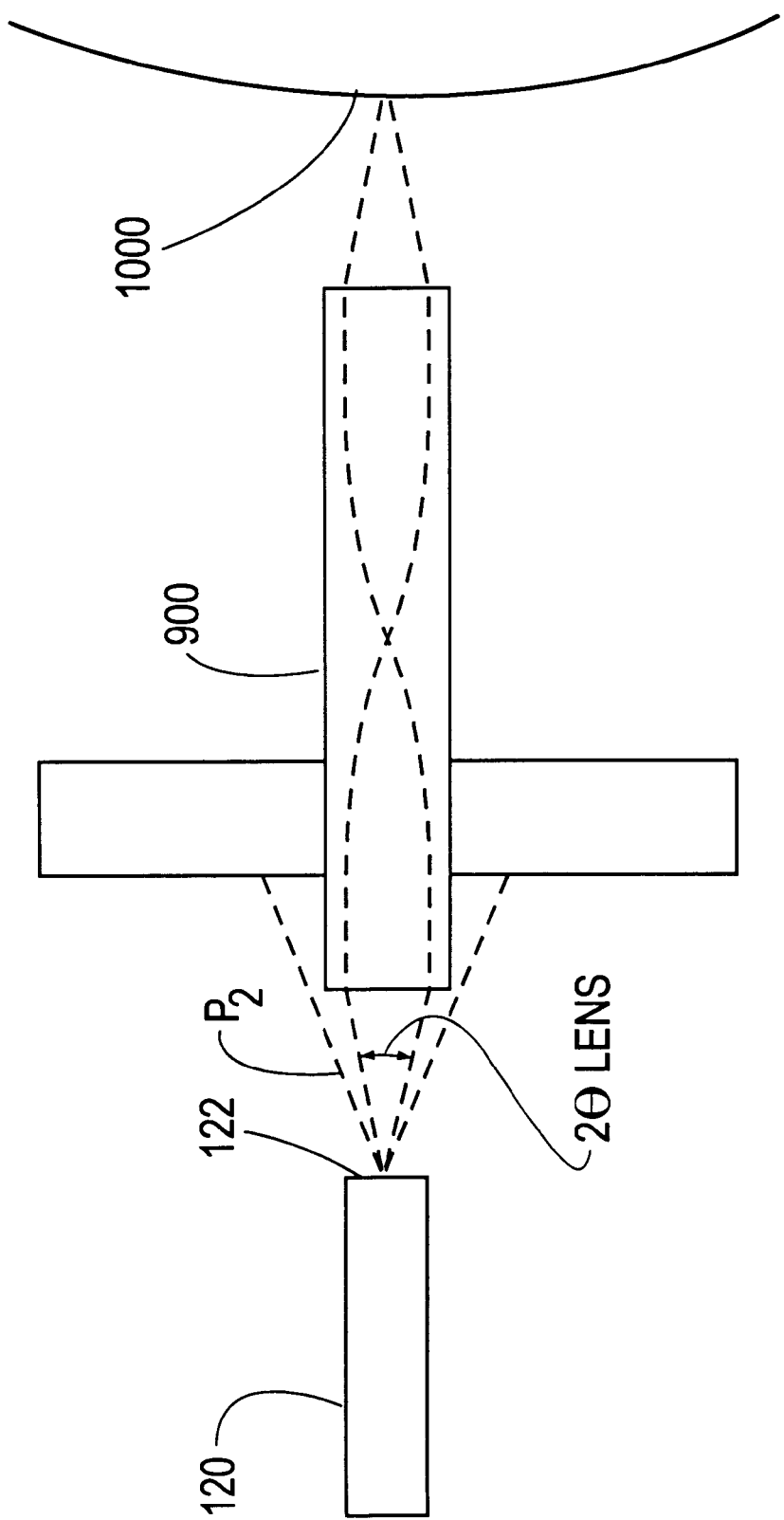
FIG. 8 illustrates the relationship between photons emitted from an edge facet and a selfoc lens.

As shown in FIG. 8, once the photons $P_2$ exit the edge facet 122, the photons $P_2$ pass through a selfoc lens 900. The selfoc lens 900 is an array of rod lenses, such as, for example, "gradient index lenses", that provide one-to-one imaging. The selfoc lens 900 subtends a limited cone of rays emitted from the edge facet 122. The collection is less efficient because the photons $P_2$ refract into a wider cone as the photons $P_2$ exit the edge facet 122. The throughput efficiency, $\eta$, of the selfoc lens 900 is given approximately by:

$$\eta = T_{lens} \left\{ \frac{1 - \sqrt{1 - \left(\frac{\sin\theta_{lens}}{n_g}\right)^2}}{1 - \frac{n_{cl}}{n_g}} \right\}, \tag{9}$$

where:

$\theta_{lens}$ is the collection half-angle of the selfoc lens 900; and $T_{lens}$ is the lens transmittance. A 20 degree collection full angle is used in conventional imagers to provide a compromise between throughput and image quality. The lens transmittance is dictated mostly by the clear aperture of the gradient index lenses.

Due to the forward directed nature of the photons $P_2$ exiting the waveguide 120, the lens throughput is higher than for the same lens used to image a purely Lambertian source. For example, with a SLA20A selfoc lens using a single row of rod lenses, a Lambertian source at typical conjugate distances will have a throughput of about 4%, whereas the edge emitter 100 passes approximately 8% of the photons $P_2$ through the same lens. In a selfoc lens 900, the lens images twice to perform a one-to-one correspondence. Therefore, the conjugate distances correspond to two imaging distances.

9. Transmission of the Collected Photons into the Photoreceptor

Table 1 is a table of modeled results for an exemplary image bar using the edge emitter 100 according to the first embodiment of this invention. As shown in Table 1, the Image Bar and Radiometry Inputs are the input assumptions and the Image Bar and Radiometry outputs are the modeled results.

The PL Efficiency is the photoluminescence efficiency ratio of the pump photons $P_1$ to the emitted photons $P_2$ in the fluorescent medium 120. The Cladding Layer Index is the reflective index of the Cladding Layer 130 and is approximately equal to the refractive index of glass. The Cladding Layer Thickness of 2 microns is the thickness t of the cladding layer 130 between the anode 116 and the fluorescent medium 120. The Emitter Width of 35 microns is the width of the anode 116 of the OLED pump diode in FIG. 4. The Absorption Coefficient is the absorption figure of merit of the fluorescent medium 120. As discussed above, the back side 140 of the edge emitter is preferably reflective, so that light is emitted from only one edge of the waveguide 120. The back reflector 140 reflects 50% of the photons $P_2$ impinging the back reflector 140.

The Radiometry Inputs relate to the optics that convey the light onto an external photoreceptor 1000 and the properties of the external photoreceptor 1000 itself. The Radiometry Inputs allow the edge emitter 100 to be modeled for specific printing or imaging applications. The Photoreceptor Dose is the required energy delivered to the photoreceptor 1000 to fully expose a unit area of the photoreceptor. The Current Density is the density of the current flowing between the anode 116 and the cathode 112 when the pump OLED 110 is maximally bright. The Half Angle is the half angle of the photons $P_2$ that actually make it through the imaging system. The Duty Cycle is the maximum amount of time that each emitter 100 in an image bar is on.

The Image Bar and Radiometry Outputs are the modeled results of the Image Bar and Radiometry Inputs. The Absorber Cross Section is the efficiency cross section, i.e., how many pump photons $P_1$ travel into the fluorescent medium/waveguide 120. The Collection Efficiency is efficiency of collecting the pump photons $P_1$ in the fluorescent medium 120. The Propagation Efficiency is the fraction of the photons $P_2$ guided by the fluorescent medium/waveguide 120 which reach the edge facet 122 of the fluorescent medium/waveguide 120.

In the preferred embodiments, the pump OLED 110 is much longer than in conventional surface emitters. The Edge Gain is the figure of merit for improvement of emission brightness in an edge emitter compared to a surface emitter. The Edge Gain accounts for both the emitter width and the waveguide length.

The Surface Quantum Efficiency is the quantity of photons $P_2$ that would be produced if the device were surface-emitting. The Absorber Cross Section is 39.8%, which is the percentage of Photons $P_1$ emitted by the OLED 110 that impinge upon the fluorescent medium/waveguide 120. The Collection Efficiency is the percentage of emitted photons $P_2$ that are captured by guided modes of the waveguide. It should be appreciated that the Edge Quantum Efficiency is ten times smaller than the Surface Quantum Efficiency. However, the edge area is also much smaller than the emitting area. Therefore, the Edge Gain of 21.6× produces many more photons per pixel using an edge-emitter rather than a surface-emitter.

In the Radiometry Outputs, the Edge Emitter Throughput is the percentage of light escaping the edge facet 122 that travels from the exit facet 122 through the selfoc lens 500. The Pixel Dose is the amount of energy required at the photoreceptor to form a single pixel of the latent image. The Photoreceptor Irradiance is the amount of light energy in joules per second that fall onto a pixel in the photoreceptor. The Line Time is the amount of time necessary to expose a scan line across the photoreceptor. The Print Volume is the amount of prints, or pages, before a single pixel in the image bar fails.

The model outlined in Table 1 illustrates a number of features of the edge emitter 100. Due to the relative refractive indices, the Absorber Cross Section Efficacy is increased, i.e., 39.8%, in comparison to the escape probability of about 20% for a surface emitting OLED emitting into air.

The collection efficiency of the waveguide 120 and the throughput of the selfoc lens 800 both depend on the refractive index of the waveguide 120. Efficient collection requires a high waveguide index because it provides better reflectivity within the waveguide 120 to confine light in the waveguide 120 and emit the generated photons $P_2$ from the exit facet 122. However, the collection efficiency of the selfoc lens 900 requires a low waveguide index to minimize the effects of ray bending as the light travels from the waveguide 120 to the selfoc lens. The Print Speed, which is directly related to the total imager quantum efficiency, is optimized by choosing a modest waveguide index, which is somewhat higher than the index of the cladding layer 130.

In order to optically couple the OLED 110 and the fluorescent medium/waveguide 120, the fluorescent medium/waveguide 120 must be designed taking the Photo-Luminescence (PL) Efficiency, discussed above, into consideration. The PL Efficiency is dependent on the material composing the fluorescent medium/waveguide 120 and the type of device used as the pumping source. The photoluminescence may be chosen by selecting a specific dye in the fluorescent medium 120 and the given pump source PL efficiency.

The calculated Print Speed for this embodiment is approximately thirteen pages per minute, which is commercially acceptable for many low end applications, such as, for example, printers used in a home or office setting. Assuming a drive current of 20 mA/cm$^2$, which is about ten times larger than the drive density needed for display applications, practical usage of OLEDs should be quite feasible and should become more so as the current injection properties of OLEDs continue to improve. This continued improvement will lower the operating voltage of passive matrix displays. The current injection properties of OLEDs have improved steadily for the last decade as better hole and electron injection layers are identified, improvements are made in the electrodes and surface treatments are discovered.

The edge emitter 100 preferably uses the brightest possible OLEDs 110. With present OLED technology, it is difficult to produce emitters 100 which are driven continually at current densities many times higher than 20 mA/cm$^2$ without accelerated degradation due to self-heating.

Figure 9:
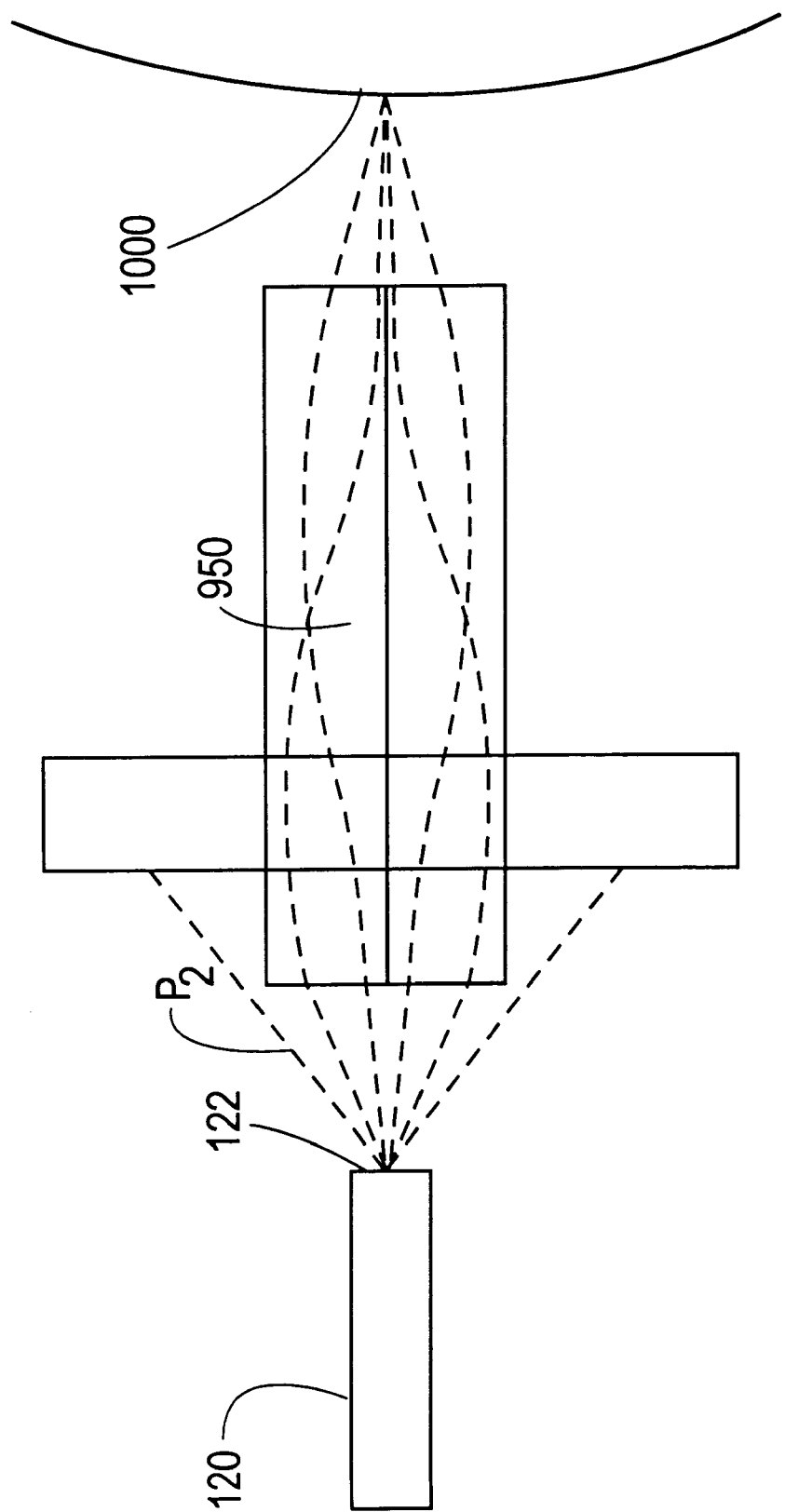
FIG. 9 illustrates the edge emitter structure according to the first embodiment of this invention used in combination with a double row selfoc lens.

Additionally, as shown in FIG. 9, a double row selfoc lens 950 may be used, so that a higher index waveguide 120 may be used to improve the collection efficiency. Improving the collection efficiency will further increase the throughput of the imager by approximately a factor of two. Alternatively, providing index matching between the fluorescent medium/waveguide 120 and the selfoc lens avoids ray bending, which increases the coupling into the imager.

However, even if the selfoc lens is located next to the end facet 122, there is still ray bending. Further, locating these devices to set up the conjugate distances results in an airgap between the waveguide 120 and the selfoc lens. It is preferred that the system design take the effect of the air gap into consideration.

Figure 10:
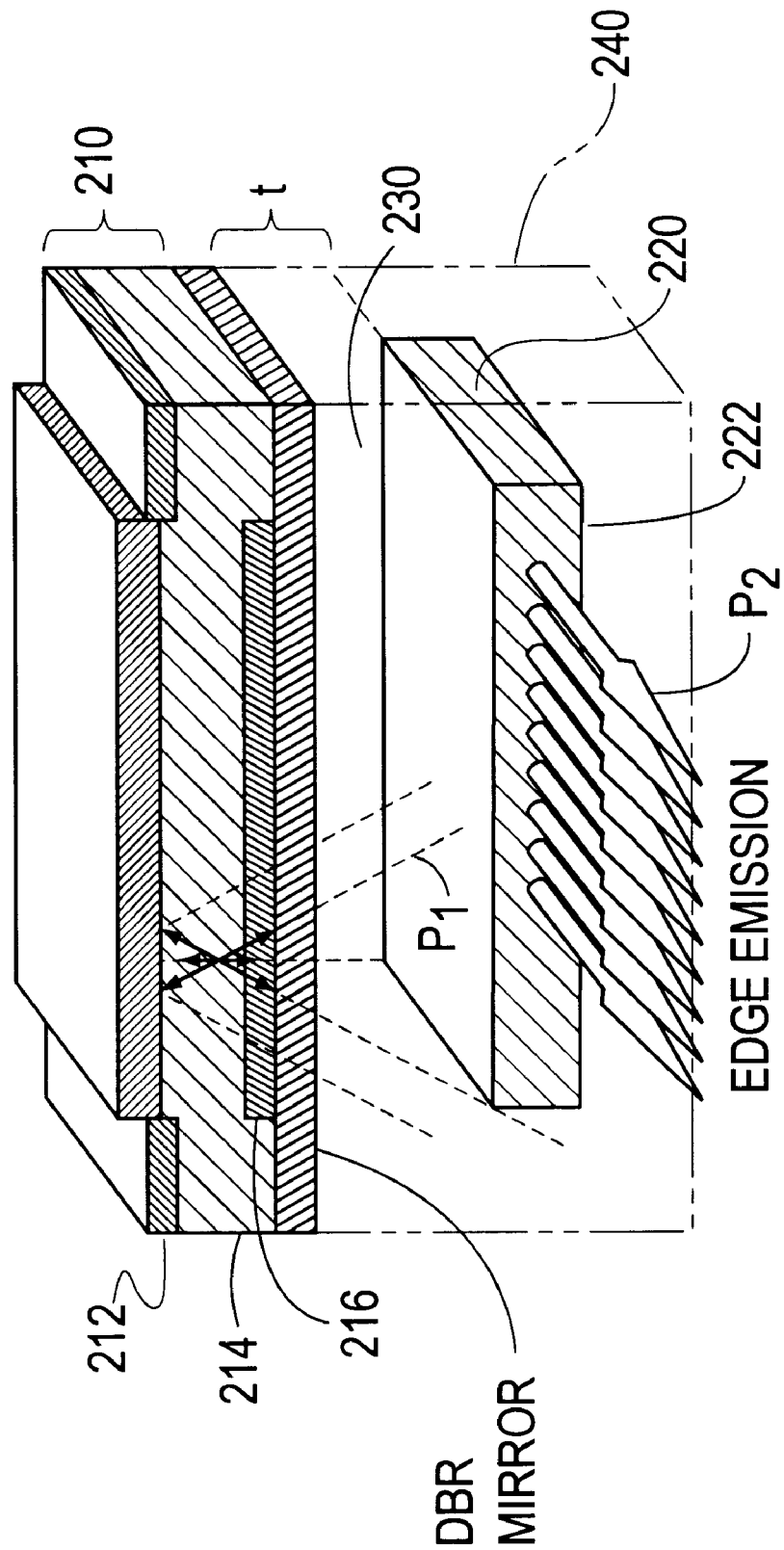
FIG. 10 illustrates an edge emitter structure including a microcavity according to a second embodiment of this invention.

As shown in FIG. 10, in a second embodiment of the invention, the Absorption Cross Section may be further improved using a microcavity OLED that would both improve the efficiency and reduce cross talk by collimating the radiation.

Figure 11:
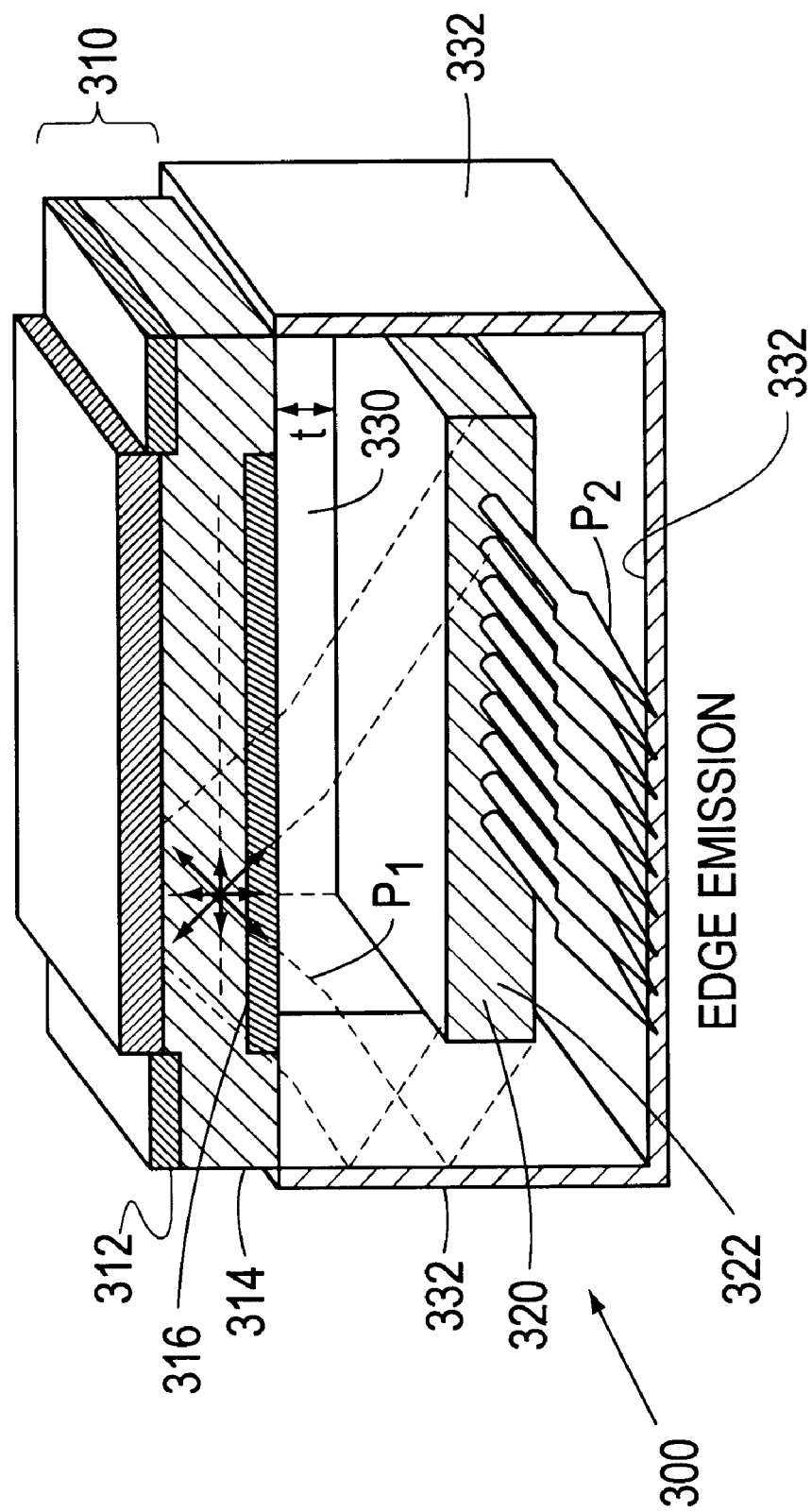
FIG. 11 illustrates an edge emitter structure with reflective surface deposited on the cladding layer according to a third embodiment of this invention.

FIG. 11 illustrates an edge emitter 300 in accordance with a third embodiment having additional reflective surfaces 332 on one or more sides of the cladding layer 330. Architecturally, there are important issues relating to cross-talk between edge emitters 100, 200 or 300 arranged in an array and waveguide loss due to the pump photons $P_1$ failing to impinge the fluorescent medium 120, 220 or 320. Neither the pump photons $P_1$ nor the emitted photons $P_2$ are captured with 100% efficiency. Using the reflective surfaces 332 decreases the aperture ratio available for the fluorescent medium 320.

The edge emitter 300 illustrated in FIG. 11 has the advantage that the pump photons $P_1$ from one diode 310 are isolated in the edge emitter 300 and do not spread to the fluorescent waveguide 320 of adjacent edge emitters 300. This isolation reduces cross-talk between the edge emitters 300 and is therefore particularly important for arrays of edge emitters 300, such as in image bars. A further advantage is that the photons $P_1$ which do not directly impinge on the fluorescent medium/waveguide 320 can be absorbed by the medium 320 after a number of reflections off the reflecting sidewalls 332 and/or the cathode 316. This reflection and absorption improves the Absorber Cross Section figure of merit in Table 1. The reflectors 332 may be formed using either metallic reflectors or distributed Bragg mirrors.

Figure 12:
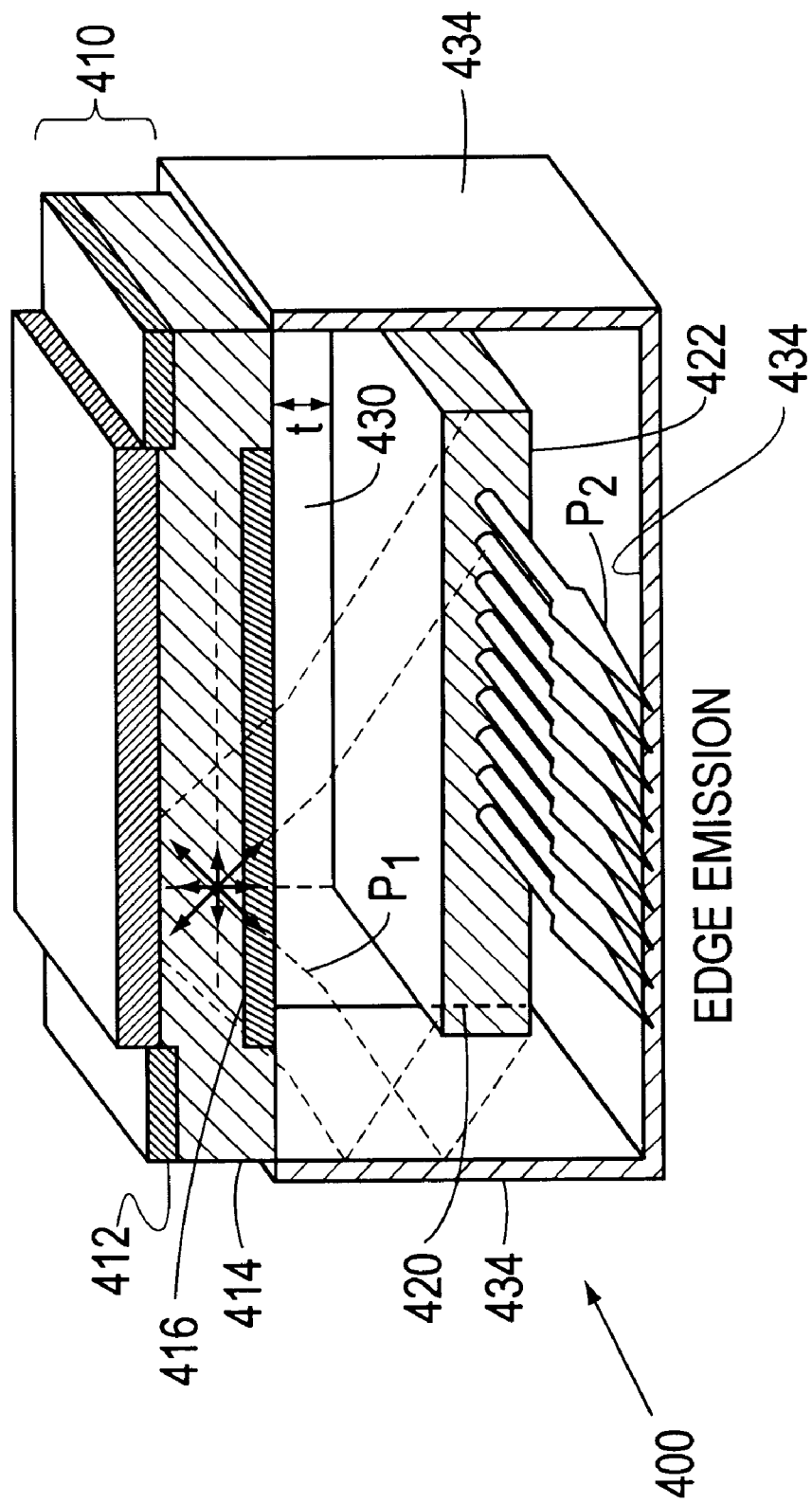
FIG. 12 illustrates an edge emitter structure with optically absorbing matrix material deposited on the cladding layer according to the third embodiment of this invention.

Alternatively, as shown in FIG. 12, one or more sides of the cladding layer 430 of an edge emitter 400 according to a third embodiment of the invention, may be covered with a dark matrix 434, i.e., an optically absorbing material. One or more of the sides of the cladding layer 430 are covered with the dark matrix material 434, which is similar to the reflectors 332 of FIG. 11. Adding the dark material 434 may not improve the Absorption Cross Section of the fluorescent medium 420 like the mirrors 332, however, the dark matrix material 434 reduces cross-talk.

Whether the reflectors 332 or the dark matrix material 434 are used, it is important that they be separated from the fluorescent medium 320 or 420 by the optical cladding layer 330 or 430 in order to prevent optical losses stemming from absorption.

Figure 13:
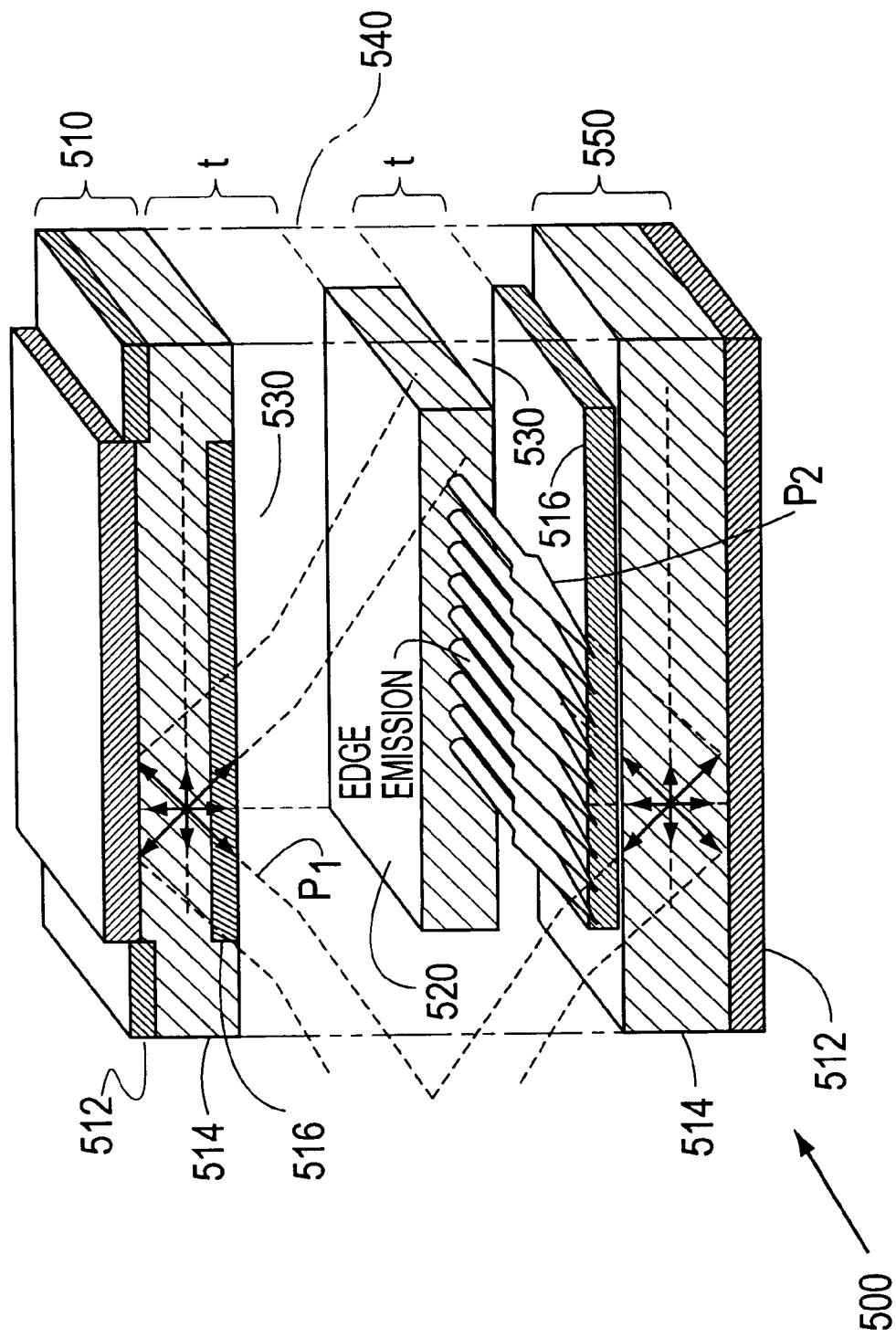
FIG. 13 illustrates an edge emitter structure in which the fluorescent medium is pumped from two sides according to a fourth embodiment of this invention.
Figure 14:
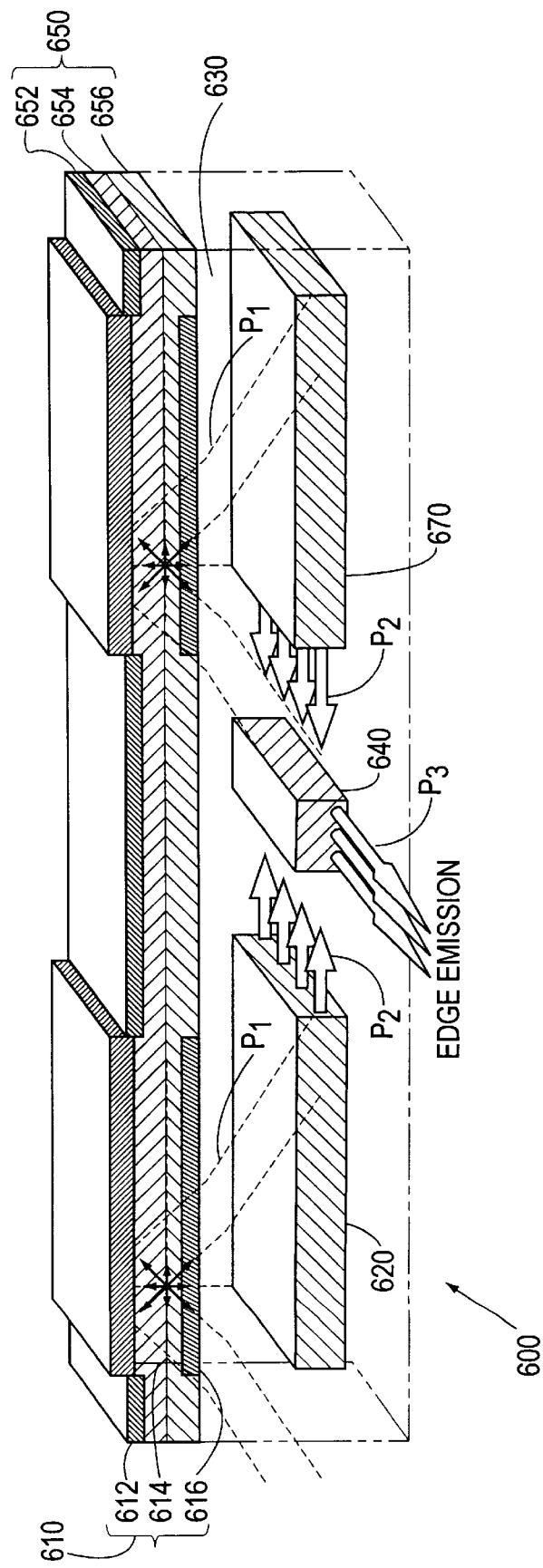
FIG. 14 illustrates a dual stage optically pumped edge emitter structure according to a fifth embodiment of this invention.

FIG. 13 illustrates an edge emitter 500 according to a fourth embodiment of the invention. As shown in FIG. 14, the fluorescent medium 520 may be pumped from two sides by a first OLED 510 and a second OLED 550, respectively. Theoretically, the edge emitter 500 according to the fourth embodiment doubles the total light output of the edge emitter 500.

FIG. 14 illustrates an edge emitter 600, a fifth embodiment of the invention. As shown in FIG. 14, the dual-stage, optically-pumped edge emitter 600 uses a first stage including a first fluorescent medium/waveguide 620 and a second fluorescent medium waveguide 670 to down-convert pump photons $P_1$ from pump OLEDs 610 and 650, respectively, into emitted photons $P_2$, and to integrate the down-converted photons $P_2$ in the broad area waveguides 620 and 670. A second stage uses a third fluorescent medium/waveguide 640, pumped by the first and second fluorescent waveguide mediums 620 and 670, to integrate the twice down-converted light in the narrow waveguide 640. The cladding layer 630 is disposed between the OLEDs 610 and 650 and the waveguides 620 and 670 and may be provided between the first stage waveguides 620, 670 and second stage waveguide 640.

Because the pumping occurs in the two stages, this structure may be able to provide sufficiently high optical pumping densities to produce stimulated emission, i.e., lasing. When stimulated emission occurs, the collection efficiency of the third fluorescent waveguide medium 640 would be enhanced because photons $P_3$ within the collection cone of the third waveguide 640 are stimulated. Thus, edge emitter 600 provides a possibility of realizing a solid state laser pumped by OLEDs.

Figure 15:
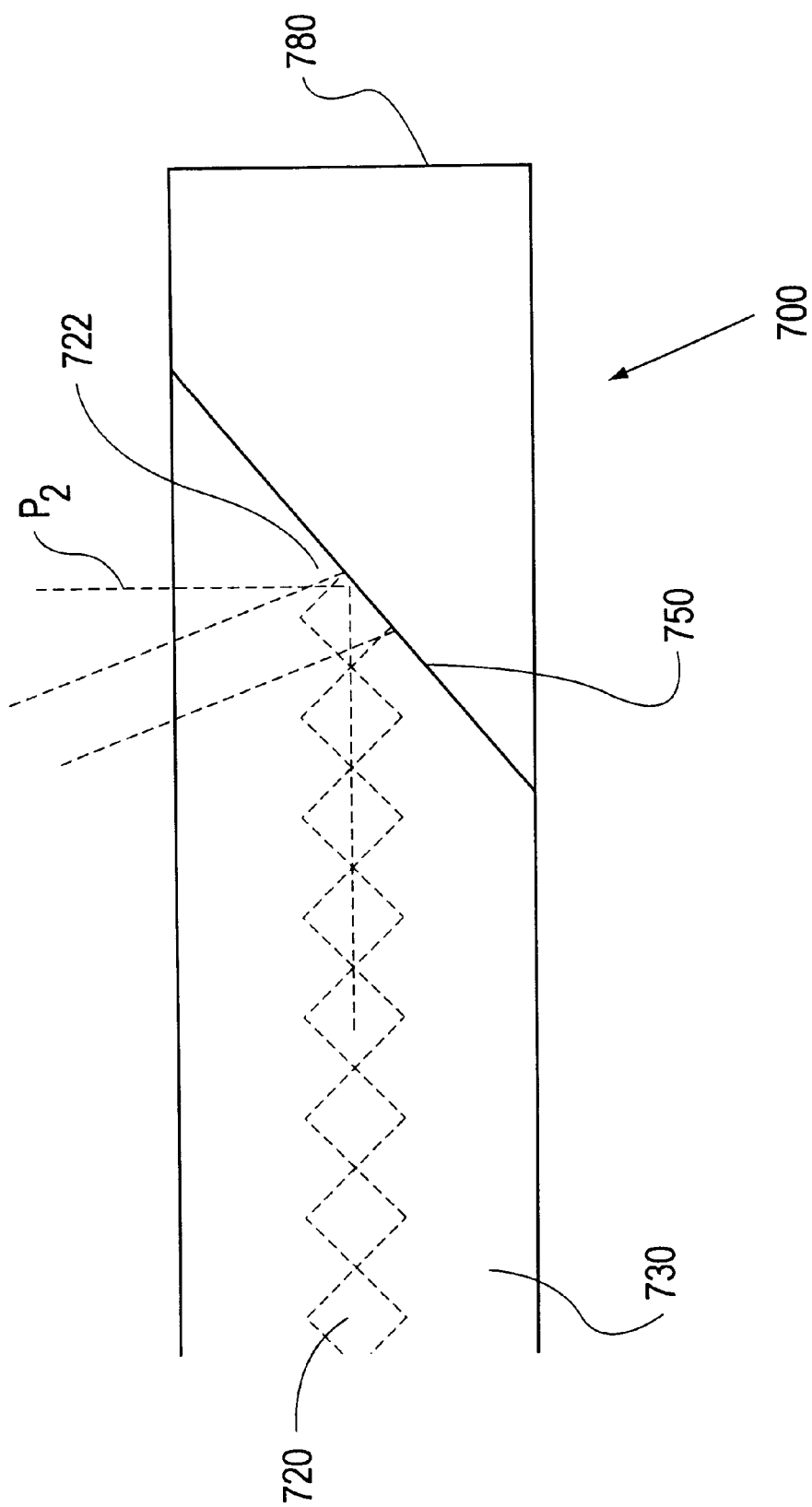
FIG. 15 illustrates a device in which an edge emitter structure is converted into a surface emitter according to a sixth embodiment of this invention.

FIG. 15 illustrates an edge emitter 700 in accordance with a sixth embodiment of the invention. As shown in FIG. 15, a mirror 750 is provided on the substrate 780 intercepting the waveguide 720 to convert the edge emitter 700 into a surface emitter. The mirror 750 is located at the edge facet 722 of the fluorescent medium/waveguide 720. The mirror 750 bends the path of the photons $P_2$ exiting the waveguide 720 out of the plane of the substrate 780. The path of the photons $P_2$ may be bent either toward or away from the surface of the substrate 780.

Figure 16:
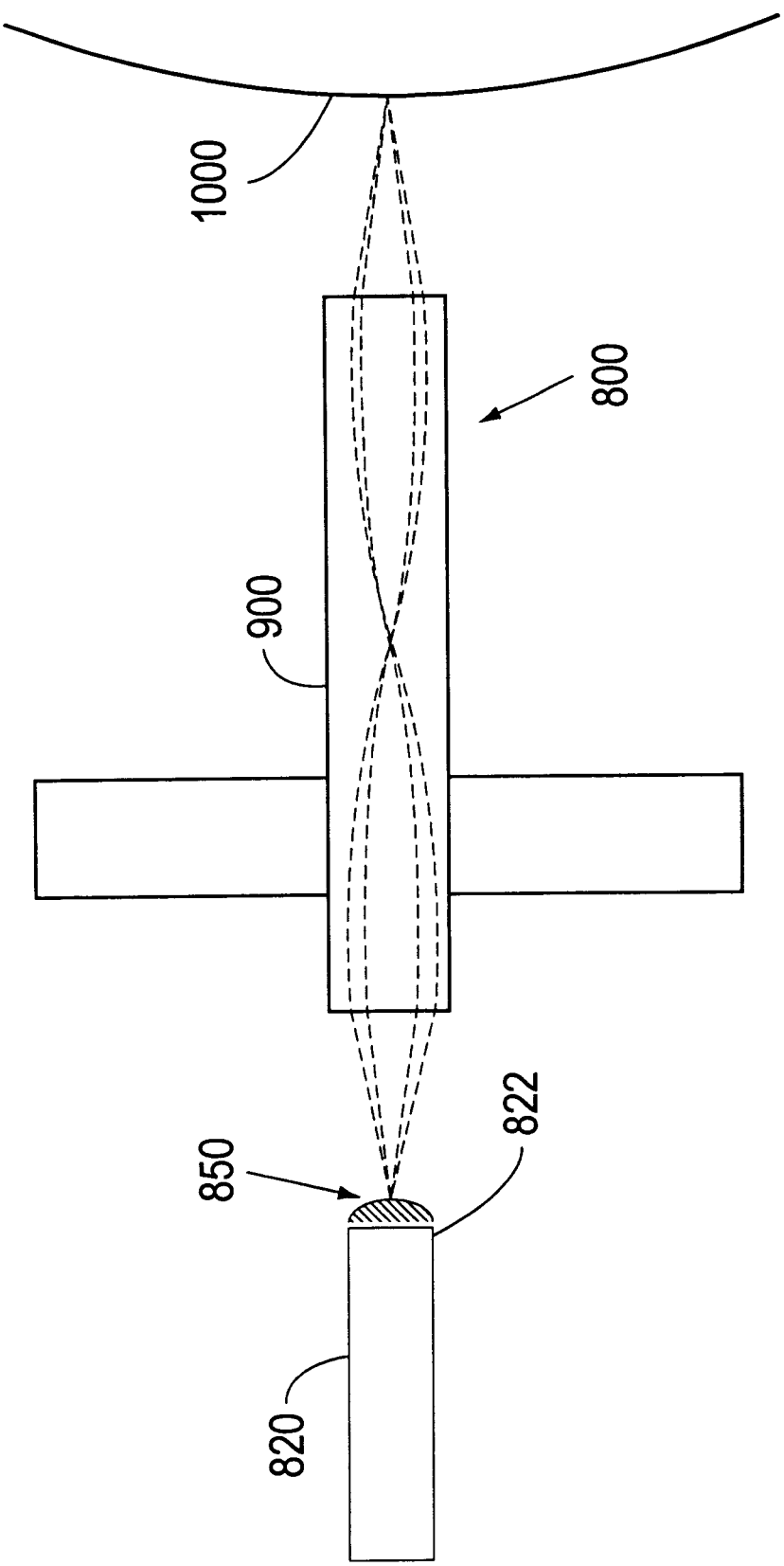
FIG. 16 illustrates an edge emitter operating in combination with a microlens and a selfoc lens according to a seventh embodiment of this invention; and Table 1 is a table of the modeled results for a hypothetical model image bar using the edge emitter structure according to the first embodiment of this invention.

FIG. 16 illustrates a edge emitter 800 in accordance with a seventh preferred embodiment of the invention. As shown in FIG. 16, a microlens 850 is provided on the end of the emitter 800 between the edge facet 822 and the selfoc lens 900. By providing the microlens 850 between the edge facet 822 and the selfoc lens 900, the effects of Snell's law are reduced. The microlens 850 acts as a relay for photons P2 emitted from the edge facet 822. The size and pitch of the microlens 850 should be designed to match the refractive index of the waveguide 820 used in the edge emitter 800 as best as possible with the correct focal lens to provide a maximal throughput to the selfoc lens 900.

All of the preferred embodiments of the invention can be used to form an OLED-based edge emitting image bar having an effective printing speed over forty times faster than the printing speed of a corresponding OLED surface emitter assuming that the two edge emitters can run at the same duty cycle, which may not be the case for comparable image quality. OLED-based edge emitter performance estimated for a system for passively integrating an OLED-pumped waveguide leads to viable print speeds and even greater print speeds if expected improvements in the performance of organic light emitting diodes are realized. The basic structure has many variations that lead to performance improvements, including the possibility of an organic solid state laser.

While this invention has been described in conjunction with the specific embodiments outlined above, it is evident that many alternatives, modifications and variations will be apparent to those skilled in the art. Accordingly, the preferred embodiments of the invention, as set forth above, are intended to be illustrative, not limiting. Various changes may be made without department from the spirit and scope of the invention.

What is claimed is:

1. A diode pumped solid state edge emitting light source device comprising:
    a pump source that produces pump photons;
    a fluorescent medium that absorbs the pump photons and produces down-converted photons with an energy level lower than an energy level of the pump photons;
    a cladding that separates the pump source and the fluorescent medium, the cladding having a lower refractive index than a refractive index of the fluorescent medium;
    wherein, the pump source illuminates the fluorescent medium, and the fluorescent medium acts as a waveguide that guides the down-converted photons out of an edge of the fluorescent medium and emits the down-converted photons as emitted photons.

2. The device of claim 1, wherein the pump source is an organic light emitting diode.

3. The device of claim 1, wherein a thickness of the cladding between the fluorescent medium and the pump source is approximately equal to a wavelength of the pump photons emitted by the pump source.

4. The device of claim 1, wherein a refractive index step between a refractive index of the cladding and a refractive index of the waveguide is within the range of approximately 0.1 to approximately 0.5 inclusive.

5. The device of claim 1, wherein the refractive index step is approximately 0.5.

6. The device of claim 1, wherein a backside of at least the fluorescent material is optically reflective so that the emitted photons are emitted from only one edge of the fluorescent material.

7. The device of claim 1, wherein the fluorescent medium comprises an edge facet from which emitted photons are emitted from the fluorescent medium.

8. The device of claim 7, further comprising a selfoc lens disposed adjacent to the edge facet that receives the emitted photons.

9. The device of claim 8, wherein the selfoc lens is a multiple row selfoc lens.

10. The device of claim 8, further comprising a microlens provided between the edge facet and the selfoc lens.

11. The device of claim 7, further comprising an optically reflective surface located at the edge facet of the fluorescent medium that redirects a path of emitted photons relative to a surface on which the device is fabricated.

12. The device of claim 1, wherein the cladding is a dielectric material that is transparent to the pump photons.

13. The device of claim 1, wherein the cladding is also provided below the fluorescent medium.

14. The device of claim 1, wherein the cladding comprises a plurality of types of thin film layers.

15. The device of claim 14, wherein each of the plurality of types of thin film layers of the cladding have indices of refraction which are lower than the index of refraction of the fluorescent medium.

16. The device of claim 1, wherein the fluorescent medium is tuned to a specific optical density.

17. The device of claim 1, wherein the fluorescent medium comprises a multilayer structure including substructures made of a fluorescing material and a light guiding material.

18. The device of claim 1, further comprising a microcavity disposed around the pump source and optically isolated from the fluorescent medium by the cladding.

19. The device of claim 1, further comprising an optically reflective material provided on at least one side of the cladding.

20. The device of claim 1, further comprising an optically absorbing material provided on at least one side of the cladding.

21. The device of claim 1, further comprising a second pump source that produces pumped photons, wherein the fluorescent medium absorbs the pumped photons produced by the second pump source and produces down-converted photons with an energy lower than an energy of the pumped photons produced by the second pump source, the cladding separates the second pump source and the fluorescent medium and the second pump source illuminates the fluorescent medium.

22. The device of claim 1, wherein the pump source is a first pump source that produces a first group of pumped photons, the fluorescent medium is a first fluorescent medium that absorbs the first group of pumped photons and produces a first group of down-converted photons, and the first fluorescent medium acts as a first waveguide that guides the first group of down-converted photons out of the first fluorescent medium and emits the first group of down-converted photons as a first group of emitted photons, the device further comprising:

a second pump source that produces a second group of pumped photons; and a second fluorescent medium that absorbs the second group of pumped photons produced by the second pump source and produces a second group of down-converted photons;

wherein, the second pump source illuminates the second fluorescent medium, and the second fluorescent medium acts as a second waveguide that guides the second group of down-converted photons out of the second fluorescent medium and emits the second group of down-converted photons as a second group of emitted photons.

23. The device of claim 22, further comprising a third fluorescent medium that absorbs the first and second groups of emitted photons emitted by the first and second fluorescent media and produces a third group of down-converted photons, the third fluorescent medium acts as a waveguide that guides the third group of down-converted photons out of the third fluorescent medium and emits the third group of down-converted photons as a third group of emitted photons.

\* \* \* \* \*